(12) United States Patent
Bandyopadhyay et al.

(10) Patent No.: US 6,501,676 B1
(45) Date of Patent: Dec. 31, 2002

(54) ACCESSING OF TWO-TERMINAL ELECTRONIC QUANTUM DOT COMPRISING STATIC MEMORY

(75) Inventors: Supriyo Bandyopadhyay, Lincoln, NE (US); David Zaretsky, Moscow (RU)

(73) Assignee: The Board of Regents of the University of Nebraska, Lincoln, NE (US)

(*) Notice: Subject to any disclaimer, the term of this patent is extended or adjusted under 35 U.S.C. 154(b) by 51 days.

(21) Appl. No.: 09/878,439

(22) Filed: Jun. 12, 2001

Related U.S. Application Data

(60) Provisional application No. 60/231,984, filed on Sep. 12, 2000.

(51) Int. Cl.[7] .............................................. G11C 11/00
(52) U.S. Cl. ........................ 365/151; 365/215; 365/217
(58) Field of Search ................................ 365/151, 215, 365/217

(56) References Cited

U.S. PATENT DOCUMENTS

| | | | | |
|---|---|---|---|---|
| 5,592,413 | A | * 1/1997 | Spitzer | 365/151 |
| 5,747,180 | A | 5/1998 | Miller et al. | 428/601 |
| 5,783,840 | A | 7/1998 | Randall et al. | 257/24 |
| 5,923,046 | A | 7/1999 | Tezuka et al. | 257/24 |
| 5,959,896 | A | 9/1999 | Forbes | 365/185.33 |
| 6,046,627 | A | * 4/2000 | Itoh et al. | 327/534 |
| 6,215,327 | B1 | * 4/2001 | Lyke | 326/10 |

OTHER PUBLICATIONS

"Electronic Bistability In Electrochemically Self–Assembled Quantum Dots: A Potential Nonvolatile Random Access Memory", by Kouklin, Bandyopadhyay, Tereshin, Varfolomeev and Zaretsky; Applied Physics Letters, vol. 76, No. 4, (Jan. of 2000).

"Electrochemically Assembled Quasi–Periodic Quantum Dot Arrays", Bandyopadhyay et al., Nanotechnology, vol. 7 p. 360–371 (1996), which shows a bright field electron microscope micrograph of pores on the order ot 10 nm which wre formed by annodization of aluminum performed in sulfuric acid.

"Intrinsic Optical Non–linearity and Second Harmonic Generation in Electrochemically Self–Assembled CdS Quantum Dots", Balandin et al., Phys. Low–Dim. Struct, 11/12, 155 (1997), describes non–linear optical properties of spatially ordered two–dimensional arrays of quantum dots.

"Quantum Transistors: Toward Nanoelectronics", Editor Linda Geppert, IEEE Spectrum (2000), discusseb tunneling in two terminal switched state devices.

"Magnetic Properties of Fe Deposited into Anodic Aluminum Oxide Pores as a Function of Particle Size" AlMawlawi et al., J. Appl. Phys. 70, 4421 (1991).

* cited by examiner

*Primary Examiner*—Richard Elms
*Assistant Examiner*—Hien Nguyen
(74) *Attorney, Agent, or Firm*—James D. Welch

(57) ABSTRACT

A method of storing and accessing data utiliaing two-terminal static memory cells made from semiconductor quantum dots. Each quantum dot is approximately 10 nm in dimension so as to comprise approximately 1000–10,000 atoms, and each memory cell has in a volume of approximately $6.4 \times 10_7$ cubic Angstroms, thereby corresponding to about 300,000 atoms. In use one of at least two possible stable states is set in the static memory cell by application of a D.C. voltage across the two terminals. The stable state is then monitored by application of A.C. voltage across the two terminals while monitoring the resulting A.C. current flow.

14 Claims, 5 Drawing Sheets frequency 100 Hz

Lateral conduction mode

Vertical conduction mode frequency 100 Hz

☐ lowest potential
☐ higher potential
▨ highest potential

US 6,501,676 B1

ACCESSING OF TWO-TERMINAL ELECTRONIC QUANTUM DOT COMPRISING STATIC MEMORY

This Application is a CIP of Provisional Application Serial No. 60/231,984 filed Sep. 12, 2000.

TECHNICAL FIELD

The present invention relates to static memory systems, and more particularly to two-terminal semiconductor Quantum Dot comprising static memory cells and arrays thereof, in which said static memory cells at least two stable states can be set by application of at least two different state switching D.C. voltage levels, said stable states being detected by the monitoring of A.C. current flow magnitude response to an applied A.C. voltage.

BACKGROUND

State of the art computer memory and logic devices are made of Complementary Metal Oxide Semiconductor (CMOS), and four devices are required per memory cell. A typical CMOS cell has a linear dimension of 2500 Angstroms, hence a typical cell volume is $2.5 \times 10^{11}$ cubic Angstroms. Thus it takes 1 Billion atoms to make a single static random access (SRAM) cell.

In contrast to CMOS cells, which are based on three terminal devices and are applied in logic circuits with fan-in and fan-out requirements, a present invention cell has only two terminals such that the memory system is functionally similar to that provided by magnetic media in which magnetic dipoles can be set to one of two stable states, and later said state detected.

Known references include a paper titled "Electronic Bistability In Electrochemically Self-Assembled Quantum Dots: A Potential Nonvolatile Random Access Memory", by Kouklin, Bandyopadhyay, Tereshin, Varfolomeev and Zaretsky, published in Applied Physics Letters, Vol. 76, No. 4, in January of 2000, which was the first publication specifically on present invention quantum state monitoring, although U.S. Pat. No. 5,747,180 to Miller et al. for which Inventor Bandyopadhyay in this Application was co-inventor, describes methodology for making Quantum Dots. Additional Patents identified are:

U.S. Pat. No. 5,923,046 to Tezuka et al., is disclosed as it describes a Quantum Dot Memory Cell in a V-shaped groove. Sensing of current conductance states allows descrimination between a "1" and "0".

U.S. Pat. No. 5,783,840 to Randall et al. is disclosed as it describes a Universal Quantum Dot Logic Cell.

Applied electric potentials allow modulating quantum states, thus controlling electron tunneling through the tunneling barriers.

U.S. Pat. No. 5,959,896 to Forbes describes a multi-state flash memory cell and method of programming single electron differences. Trapped electrons cause change in drain current of a transistor.

Additional references include "Electrochemically Assembled Quasi-Periodic Quantum Dot Arrays", Bandyopadhyay et al., Nanotechnology, Vol. 7 P. 360–371 (1996), which shows a bright field electron microscope micrograph of pores on the order to 10 nm which were formed by annodization of aluminum performed in sulfuric acid.

Another known article, which describes magnetic properties of spatially ordered two-dimensional arrays of quantum dots, is titled "Magnetic Properties of Fe Deposited into Anodic Aluminum Oxide Pores as a Function of Particle Size", AlMawlawi et al., J. Appl. Phys. 70, 4421 (1991).

An article which describes non-linear optical properties of spatially ordered two-dimensional arrays of quantum dots, is "Intrinsic Optical Non-linearity and Secoind Harmonic Generation in Electrochemically Self-Assembled CdS Quantum Dots", Balandin et al., Phys. Low-Dim. Struct, 11/12, 155 (1997).

An article which discusses tunneling in two terminal switched state devices is "Quantum Transistors: Toward Nanoelectronics", Editor Linda Geppert, IEEE Spectrum (2000).

Even in view of the cited references, there remains need for improved quantum-dot based, non-volatile two-terminal electronic bistable memory systems, and methods of sensing quantum states therein.

DISCLOSURE OF THE INVENTION

In its most basic sense, the present invention system can be described as comprising, in functional combination:

means for sequentially applying D.C. and A.C. voltages to memory cells which are comprised of quantum dots, said means for applying D.C. and A.C. voltages including means for measuring A.C. current flow; and a two-terminal static memory cell comprised of Quantum Dots, said two-terminal static memory cell having at least two stable states that can be set by application of at least two different state switching D.C. voltage levels across said two terminals, said stable states being detectable by the monitoring of A.C. current flow magnitude response to an applied A.C. voltage, also applied across said two terminals. Further, a preferred present invention two-terminal static memory cell typically provides that each Quantum Dot therein be comprised of semiconductor and be approximately 10 nm in diameter so as to comprise approximately 1000–10,000 atoms, such that each memory cell has in a volume of approximately $6.4 \times 10^7$ cubic Angstroms, (which corresponds to about 300,000 atoms), such that each memory cell is comprised of a multiplicity of said Quantum Dots.

The present invention is further, in combination with means for applying D.C. and A.C. voltages to memory cells comprising quantum dots, which means for applying D.C. and A.C. voltages include means for measuring A.C. current flow, an array of such two-terminal static memory cells, each two-terminal static memory cell in said array thereof being comprised of Quantum Dots, wherein for each static memory cell at least two stable states can be set by application of at least two state switching D.C. voltage levels, said stable states being detectable by the monitoring of A.C. current flow magnitude response to an applied A.C. voltage. And again each present invention two-terminal static memory cell typically provides that each Quantum Dot is made of semiconductor and is approximately 10 nm in diameter so as to comprise approximately 1000–10,000 atoms, such that each memory cell has in a volume of approximately $6.4 \times 10^7$ cubic Angstroms, (which corresponds to about 300,000 atoms), such that each memory cell is comprised of a multiplicity of said Quantum Dots.

Present invention two-terminal static memory cells then enable setting one or another stable state therein by the application of a D.C. voltage level in one of a plurality of ranges across said two terminals thereof. The stable state set is readable, or retrievable by application of an A.C. voltage in combination with monitoring current flow level caused thereby.

Again, while not limiting, for emphasis it is repeated that present invention static memory cells preferably comprise 10 nm dimension semiconductor Quantum Dots and that a present invention static memory cell occupies a volume on the order of $6. \times 10^7$ cubic Angstroms, (which corresponds to about 300,000 atoms). This represents a 3000+ times improvement over packing density presently possible in CMOS systems. It is noted that each 10 nm dimension Quantum Dot comprises 1000–10,000 atoms, hence multiple Quantum Dots comprise a single present invention Static Random Access Memory (SRAM) cell. In the context of the recited dimensions it is noted that the operational principal of the present invention is thought to involve tunneling behavior between the Quantum Dots which are semiconductor in nature, which semiconductor Quantum Dots function as carrier traps of more or less efficiency, depending on the state set therein. (It is noted that intial work has utilized CdS as the semiconductor, but that use of any semiconductor is within the scope of the present invention).

A method of the present invention involves providing a present invention static memory cell as described above, then setting it into one or another stable state by the application of a D.C. voltage level in one or another range of D.C. voltages, and then monitoring or retrieving said set stable state by application of an A.C. voltage in combination with monitoring current flow level caused thereby. Of course said method can include resetting the stable state and repeating the described procedure. When an array of said static memory cells are present and each is involved in practice of the method, it should be appreciated that a digital memory function, functionally essentially transparent to that enabled by multiple dipole cell providing magnetic media, is enabled.

It is noted that realized present invention system static memory cells have demonstrated bistable states.

The present invention will be better understood by reference to the Detailed Description Section of this Specification, with reference to the Drawings.

SUMMARY

It is therefore a primary objective and/or purpose of the present invention to:

in the context of two-terminal static memory cells made from quantum dots, wherein each quantum dot is approximately 10 nm in dimension so as to comprise approximately 1000–10,000 atoms, and wherein each memory cell has in a volume of approximately $6.4 \times 10^7$ cubic Angstroms, corresponding to about 300,000 atoms, teach setting therein, by application of D.C. voltages, and monitoring, by application of A.C. voltages across the two terminals thereof while monitoring resulting A.C. current flow, at least two possible stable states.

It is another objective and/or purpose of the present invention to teach arrays of two-terminal static memory cells made from quantum dots, each being as described in the primary objective and/or purpose.

Other objectives and/or purposes of the present invention will become apparent by reference to the Specification and Claims.

DETAILED DESCRIPTION

The technique of U.S. Pat. No. 5,747,180 to Miller et al., for which Inventor Bandyopadhyay in this Application was co-inventor, describes preferred methodology for making Quantum Dots such as those which comprise present invention static memory cells, and said 180 Patent is incorporated by reference hereinto for technical insight.

As specific disclosure, as presented in a paper titled "Electronic Bistability in Electrochemically Self-Assemled Quantum Dots: A Potential Nonvolatile Random Access Memory", Kouklin, Bandyopadhyay, Tereshin, Varfolomeev and Zaretsky, App. Phys. Letters, Vol. 76, No. 4 (Jan. 24, 2000), (incorporated herewithin by reference), it is noted that there is currently significant interest in self-assembled spatially ordered two-dimensional arrays of quantum dots, produced, for instance, by electrodeposition of materials in anodic alumite film. Such systems present with magnetic, optical and electronic properties, the later of which is the focus of the present invention.

Specific realization efforts by the inventors to date have provided non-limiting present invention static memory cells comprising regimented two-dimensional arrays of CdS quantum dots which were self-assembled by electrodeposition of CdS in 10 nm dimension pores, which pores were formed in alumina film (alumina). The electrodeposition comprised D.C. anodizing of aluminum in 15% sulfuric acid. While not provided herein, it is noted that FIG. 1 in the Kouklin et al. article in App. Phys. Letters, Vol. 76, No. 4 (Jan. 24, 2000), shows a raw atomic force micrograph of pores on the order of 52 nm produced by anodizing aluminum in oxalic acid. Further, FIG. 3 in an article titled "Electrochemically Assembled Quasi-Periodic Quantum Dot Arrays", Bandyopadhyay et al., Nanotechnology, Vol. 7 P. 360–371 (1996), shows a bright field electron microscope micrograph of pores on the order of 10 nm which were formed by annodization of aluminum performed in sulfuric acid.

Quantum dots formed by the described technique have been chracterized by various microscopy, spectrometry, ellipsometry, energy-dispersive x-ray analysis, Auger depth profiling etc. Results have consistently indicated that the periphery of the formed dots was depleted of carriers because of Fermi-level pinning by interface states. This results in a potential barrier around each quantum dot, which may play an important roll in the bistable memory effect demonstrated by the fabricated stable static memory cells reported herein.

Continuing, to carry-out two-terminal electrical measurements circular samples of 1 cm daimeter, each containing over $10^{11}$ quantum dots were prepared. An array of 60 gold contact pads (0.1 mm×0.1 mm cross section and thickness 300 Angstroms), were first deposited on the top surface of every sample by resistive evaporation. Spacing between edges of adjacent contacts was on the order of 100 microns. Said gold pads were used as current and voltage probe contacts.

Figure 1A:
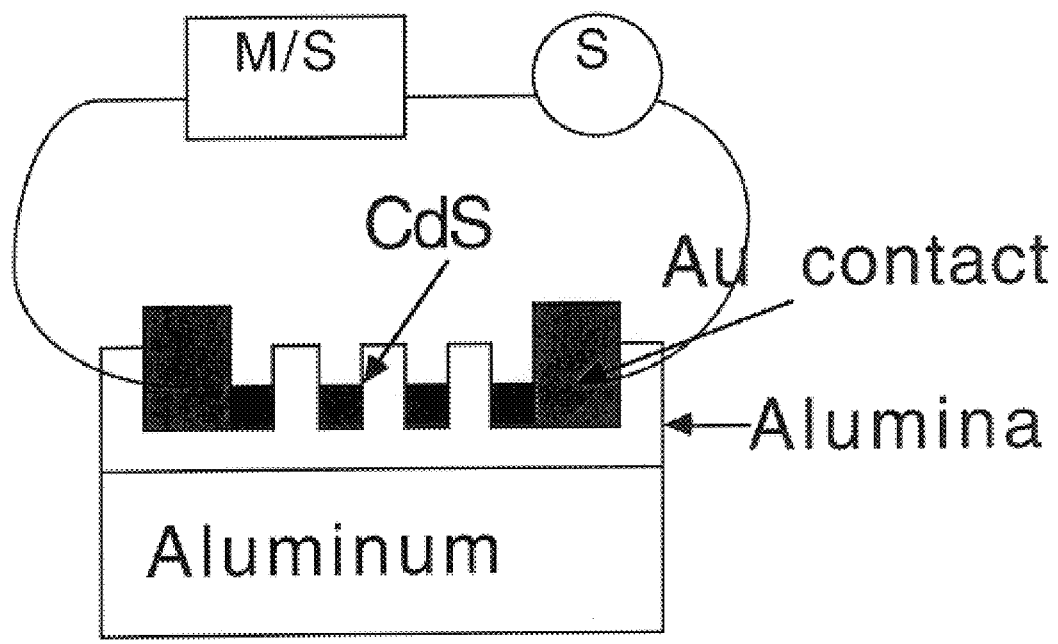
FIGS. 1a and 1b show, respectively, systems for measuring Current-Voltage (I–V) characteristics in Lateral and Vertical configurations.
Figure 1B:
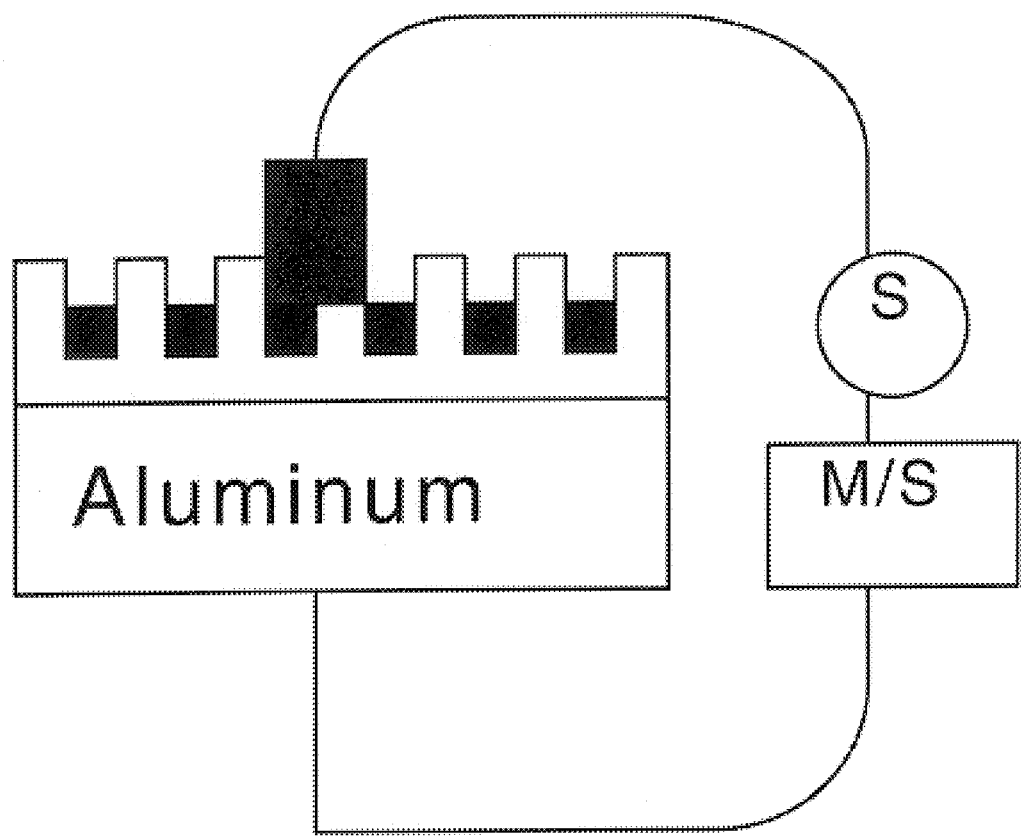

FIGS. 1a and 1b show, respectively, that Current-Voltage (I–V) characteristics were measured in Lateral and Vertical configurations. In the FIG. 1a lateral confuguration two gold pads on the surface were utilized as contacts, and in the FIG. 1b vertical configuration a gold contact pad on top and the aluminum substrate were used as terminals.

Figure 2:
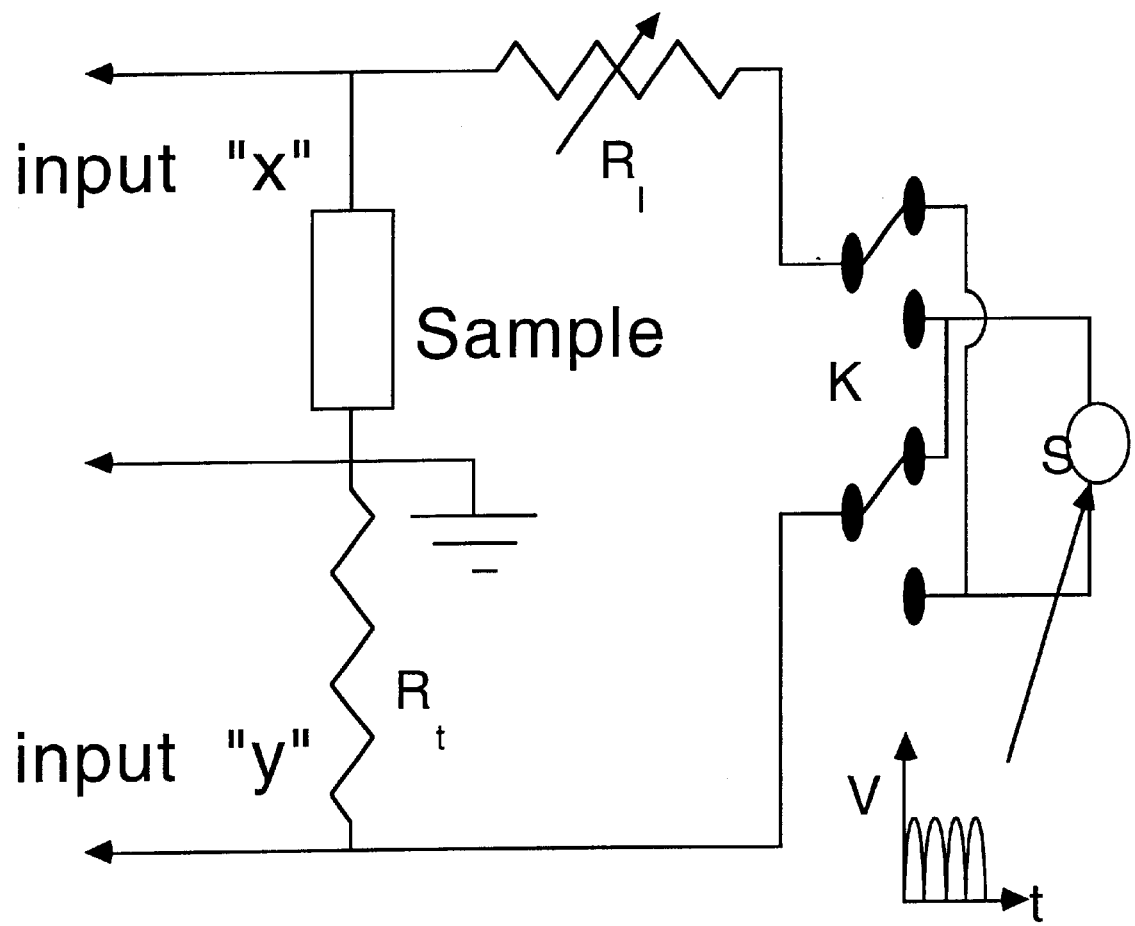
FIG. 2 shows a static memory cell "state-monitoring" circuit arrangement.

FIG. 2 shows a static memory cell "state-monitoring" circuit arrangement. It is indicated that a half-wave rectifying voltage source was used to monitor current-voltage characteristics and a current limiting resistor ($R_l$) was used to limit current flow through the sample and a test resistor ($R_t$), which resistor ($R_t$) was used to sample the current. A two-way switch (K) was used to reverse the polarity of the applied voltage. Signals at terminals "x" and "y" were fed to high impedance X and Y oscilloscope inputs.

Figure 3A:
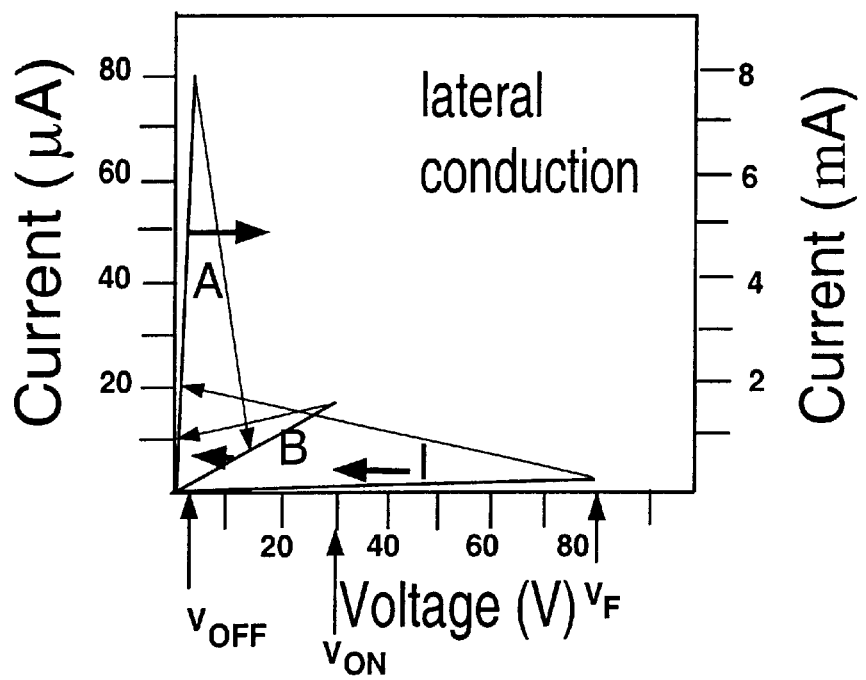
FIG. 3a shows the composite I–V characteristic of 20 samples in the first set measured in the FIG. 1a lateral configuration.
Figure 3B:
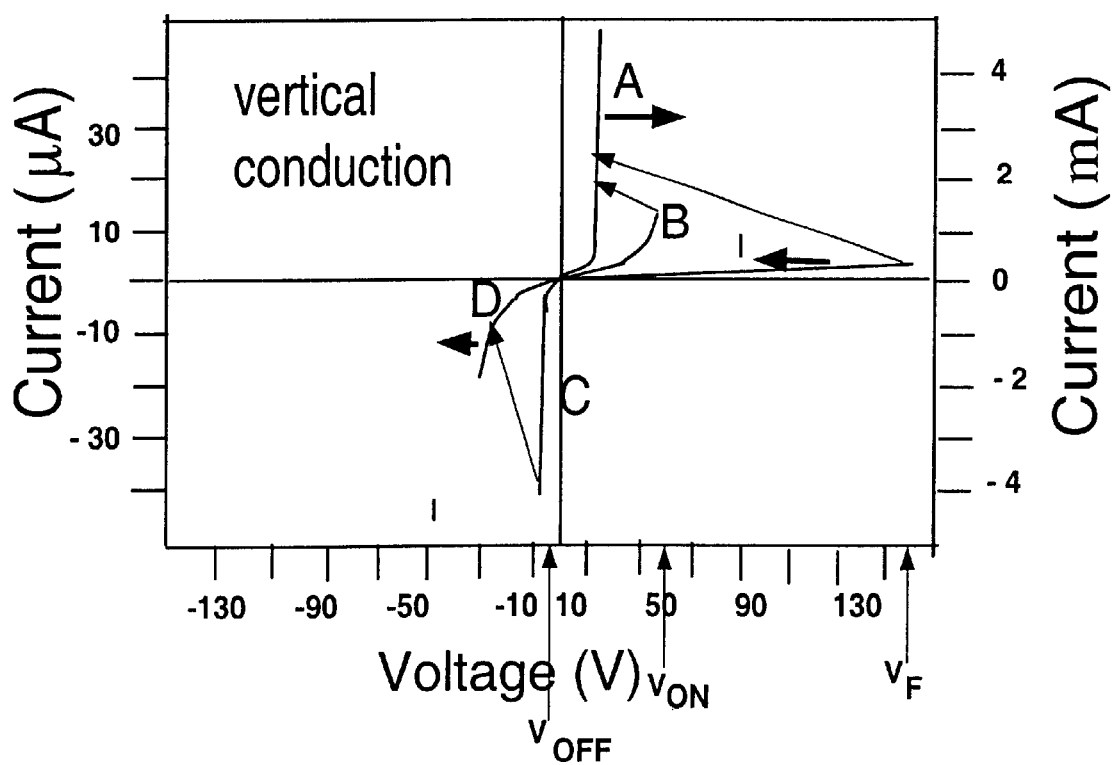
FIG. 3b shows similar composite I–V characteristic results where the FIG. 1b vertical configuration was utilized.

FIG. 3a shows the composite I–V characteristic of 20 samples in the first set measured in the FIG. 1a lateral configuration, and FIG. 3b shows similar composite I–V characteristic results where the FIG. 1b vertical configuration was utilized.

Focusing first on the FIG. 3a results, it is noted that initially the limiting resistor ($R_l$) is set to 25 K-ohm and the I–V characteristic is measured quasistatically. The characteristic is linear (curve I) and the resistance is approximately 40 M-ohm. A virgin sample is always in this very low conductance state to begin. When the applied bias (peak to zero) is increased to about 80 Volts ($V_F$), the resistance suddenly switches to about 500 Ohms. Limiting Resistor ($R_l$) is then rediced to 1 K-ohm and the bias increased. The I–V characteristic traces the linear curve A until the current reaches about 8 MA. The sample then switches suddenly to a low conductance state of resistance 1.5 M-ohm (curve B). Limiting Resistor ($R_l$) is then increased to back up to 25 J-ohm and the I–V characteristic is measured. Curve B is traced up to a Voltage of about 30 V ($V_{on}$), but then there is another sudden switch back to the old high conductance state (Curve A). The sample reproducibly switches back and forth between Curve Branches A and B. As mentioned, FIG. 3b shows the I–V characteristic for the vertical conduction mode. Note that the I–V characteristic is rectifying (non-symetic) about the origin), and nonlinear. This is expected based on the different contacts materials (ie. Al and Au). Assuming that forward bais indicates the case where the potential applied to the top gold contact is more positive that that applied to the bottom Aluminum contact, note that under the first pass utilizing Forward Bias, where the Limiting Resistor ($R_l$) is set to 85 K-ohm, a linear curve (I) is traced and the sample demonstrates a very low conductance, (eg. 140 M-ohm), until the Voltage reaches about 140 Volts. At that point the sample switches to the high conductance state (Curve A). The limiting Resistor ($R_l$) is then reduced to 1 K-ohm and the I–V characteristic is measured under forward bias, with the result being that Curve A is traced. In contrast to the results obtained from investigation of the FIG. 3a lateral contact case, no switch to a low conduction mode was observed in Curve A. However, if the polarity of the applied voltage is reversed, then the characteristic traces Curve C and the sample switches to the Low Conductance State when the Voltage over the sample falls to about −1 V. Once in the low Conductance state (Curve D), the Limiting Resistor ($R_l$) is reset to 25 K-ohm and the Applied Voltage is varied. The I–V characteristic traces Curve D in reverse bias and does not switch to the high Conductance state. When forward biased, Curve B is traced and there is an abrupt switching to the High Conductance State (Curve A), when the Voltage over the sample reaches +40 V.

The bistablity is non-volatile. If the power is switched off while the sample is in the low conductance state, the sample stays in the low conductance state. Similarly, when the power is switched off when the sample is the high conductance state it remains in the high conductance state. This is true over at least a period of 180 hours. In view thereof it should be appreciated that the room temperature I–V characteristics described with respect to FIGS. 3a and 3b make the present invention static memory cells applicable to realization of nonvolatile memory. For instance the low conductance state can be assigned as a "0" bit and a high conductance state can be assigned as a "1" bit, with write capability being accomplished by application of D.C. Voltages, and with read capability being accomplished via application of A.C. Voltages and accompanying measurement of currents caused to flow thereby.

It is also noted that the effects of temperature on present invention static switching cells was investigated. In particular it was determined that below 77 Degrees Kelvin the I–V characteristics can not be measured because the conductance drops rapidly with temperature. This suggests that the conduction process is thermally activated.

Figure 4A:
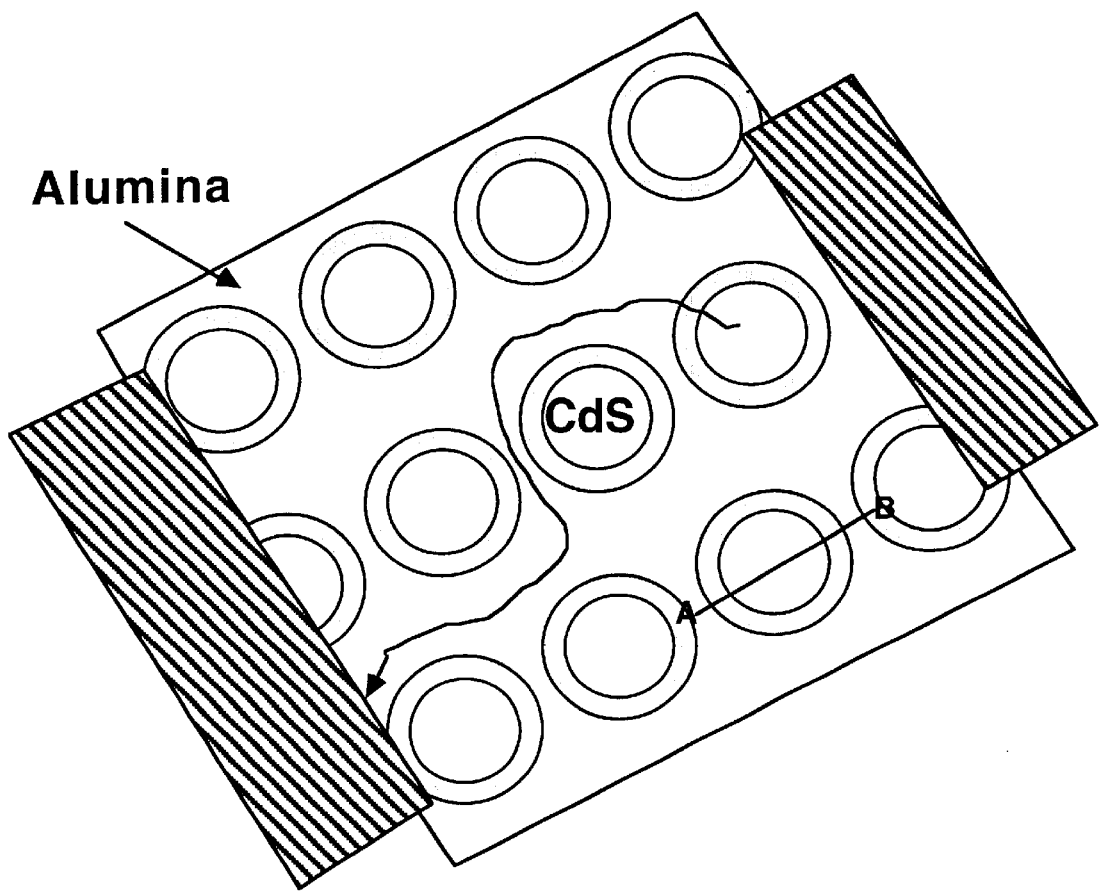
FIGS. 4a and 4b demonstrate a proposal that potential barriers about CdS quantum dots are nonsymetric so that it is easier to tunnel out of the traps (from the CdS to aluminum), than to tunnel back into the traps (from the alumina to the CdS), based on electric field demonstration and Conduction Energy-Band representation, respectively.
Figure 4B:
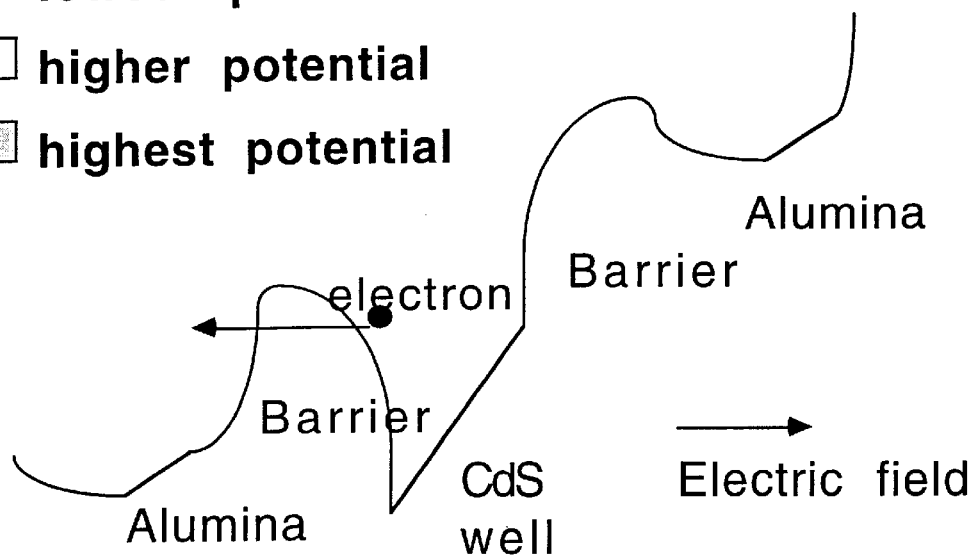

As explanation of how the present invention static memory cells work, it is proposed that the CdS quantum dots can be viewed as localized traps surrounded by potential barriers which come about as the result of band-bending associated with interface states at the periphery of each dot. Before electrically stressing the sample (ie. excursion along Curve I), most carriers are trapped in the CdS dots and the conductance is low. The stressing field, (at $V_f$), lowers the barriers around the traps just enough to cause the trapped carriers to tunnel through or thermionically emit over the bariers into the alumina. This raises the conductivity and switches the system into the high conductance state. The emitted carriers screen the applied electric field so that the barriers are raised once again. Therefore the traps cannot recapture the carriers since the raised barriers intervene. This explains why the high-conductance state is non-volatile. It is also proposed that the potential barriers are nonsymetric so that it is easier to tunnel out of the traps (from the Cds to alumina), than to tunnel back into the traps (from the alumina to the CdS). FIGS. 4a and 4b demonstrate this possibility visually from electric field and Energy-Band viewpoints respectively. FIG. 4a specifically shows a two-dimensional potential profile seen by a carrier on the surface. A carrier is emitted from the potential well (CdS) under an applied electric field, and it tunnels through the potential barrier surrounding a (CdS) quantum dot into the alumina. It cannot be recaptured by the dot because the potential barrier blocks recapturing events. The released carrier makes its way to a contact, (eg. via the shown meandering line), and contributes to the current. FIG. 4b shows the Conduction-Band for an electron along the line A–B in FIG. 4a, when a potential is applied between laterally indicated contacts. Where a hole is the carrier a similar Valance-Band diagram applies. Further, when the bias in the high conductance state exceeds a critical value (corresponding to $V_{off}$), the barriers are again lowered sufficiently to allow the emitted carriers to tunnel back through or thermionically emit over the barriers and fall down into the traps. This recapture event switches the conductivity back to a low conductance state. Since the recaptured carriers cannot re-emit from the traps without the assistance of a strong external electric field, the low conductance state is also nonvolatile. Only when a sufficiently strong electric field is applied, can the traps re-emit again thereby allowing the high conductance state to be revisited.

It is noted that the results described herein were obtained utilizing (CdS) as the semiconductor and alumina formed atop aluminum as the substrate, by anodizing the aluminum in sulfuric acid to produce alumina, an anodic alumite flim, however any functional substrate and semiconductor can be utilized in practice of the present invention. For instance semiconductors can be selections from the group consisting of silicon, germanium, and gallium-arsenide and others. In addition, the substrate can be of other than aluminum, and can be mae of silicon for instance.

Finally, while application of an A.C. voltage and detection of A.C. curent flow has been used as an example herein, it is to be understood that any impedance monitoring approach such as application of A.C. current and monitoring of an A.C. voltage response, is to be considered equivalent.

Having hereby disclosed the subject matter of the present invention, it should be obvious that many modifications, substitutions, and variations of the present invention are possible in view of the teachings. It is therefore to be understood that the invention may be practiced other than as specifically described, and should be limited in its breadth and scope only by the Claims.

We claim:

1. A system for storing and retrieving data, which, in functional combination, comprises:
   a two-terminal static memory cell comprised of quantum dots in a substrate, wherein said two-terminal static memory cell at least two stable states can be set by application of at least two different state switching D.C. voltage levels, said stable states being detectable by the monitoring of A.C. voltage/current magnitude response to an A.C. current/voltage applied to said two terminals.

2. A system as in claim 1, wherein each quantum dot therein is made of semiconductor in said substrate, and is approximately 10 nm in dimension so as to comprise approximately 1000–10,000 atoms, and wherein each two-terminal static memory cell has in a volume of approximately $6.4 \times 10^7$ cubic Angstroms which corresponds to about 300,000 atoms, such that each two-terminal static memory cell is comprised of a multiplicity of said quantum dots.

3. A system as in claim 2, wherein the semiconductor is CdS and the substrate is aluminum.

4. A system as in claim 2, wherein the semiconductor is selected from the group consisting of:
   silicon;
   germanium; and
   gallium-arsenide.
   and the substrate is selected from the group consisting of:
   aluminum; and
   silicon.

5. A system for storing and retrieving data, which, in functional combination, comprises:
   means for sequentially applying D.C. and A.C. voltages/currents to memory cells which are comprised of quantum dots, said means for applying D.C. and A.C. voltages/currents including means for measuring A.C. current/voltage; and
   an array of two-terminal static memory cells in a substrate, each two terminal static memory cell thereof being comprised of quantum dots, wherein for each two-terminal static memory cell at least two stable states can be set by application of at least two different state switching D.C. voltage levels, said stable states being detectable by the monitoring of A.C. voltage/current flow magnitude response to an A.C. current/voltage applied to said two terminals.

6. A system as in claim 5, wherein each quantum dot is made of semiconductor in said substrate and is approximately 10 nm in dimension so as to comprise approximately 1000–10,000 atoms, and wherein each memory cell has in a volume of approximately $6.4 \times 10^7$ cubic Angstroms which corresponds to about 300,000 atoms, such that each memory cell is comprised of a multiplicity of said quantum dots.

7. A system as in claim 6, wherein the semiconductor is CdS and the substrate is alumina.

8. A system as in claim 6, wherein the semiconductor is selected from the group consisting of:
   silicon;
   germanium; and
   gallium-arsenide.
   and the substrate is selected from the group consisting of:
   aluminum; and
   silicon.

9. A method of performing digital memory storage comprising the steps of:
   a. providing a system for storing and retrieving data, which, in functional combination, comprises:
      means for sequentially applying D.C. and A.C. voltages/currents to memory cells which are comprised of quantum dots, said means for applying D.C. and A.C. voltages/currents including means for measuring A.C. impedance; and
      a two-terminal static memory cell comprised of quantum dots in a substrate, wherein said two-terminal static memory cell at least two stable states can be set by application of at least two different state switching D.C. voltage levels, said stable states being detectable by the monitoring of A.C. voltage/current flow magnitude response to an A.C. current/voltage applied to said two terminals;
   b. setting a stable state in said two-terminal static memory cell by application of a D.C. voltage across said two terminals;
   c. monitoring said set stable state by monitoring of A.C. voltage/current flow magnitude response to an A.C. current/voltage applied to said two terminals.

10. A method of performing digital memory storage as in claim 9 wherein the step of providing a two-terminal static memory cell comprised of quantum dots involves providing a two-terminal static memory cell wherein each quantum dot is made of semiconductor and is approximately 10 nm in dimension so as to comprise approximately 1000–10,000 atoms, and wherein each memory cell has in a volume of approximately $6.4 \times 10^7$ cubic Angstroms which corresponds to about 300,000 atoms, such that each memory cell is comprised of a multiplicity of said quantum dots.

11. A method of performing digital memory storage comprising the steps of:
   a. providing a system for storing and retrieving data, which, in functional combination, comprises:
      means for sequentially applying D.C. and A.C. voltages/currents to memory cells which are comprised of quantum dots, said means for applying D.C. and A.C. voltages/currents including means for measuring A.C. impedance; and
      a plurality of two-terminal static memory cells in a substrate, each being comprised of quantum dots, wherein each two-terminal static memory cell at least two stable states can be set by application of at least two different state switching D.C. voltage levels across the two terminals thereof, said stable states being detectable by the monitoring of A.C. voltage/current magnitude response to an applied A.C. current/voltage;

b. setting stable states in at least two of said two-terminal static memory cells by, for each of said at least two static memory cells, application of a D.C. voltage across the two terminals of each thereof;

c. monitoring said set stable state in at least one of said two static memory cells by monitoring of A.C. voltage/current flow magnitude response to an A.C. current/voltage applied to said two terminals thereof.

12. A method of performing digital memory storage as in claim 11 wherein the step of providing a plurality of two-terminal static memory cells involves providing two-terminal static memory cells wherein each quantum dot thereof is made of semiconductor and is approximately 10 nm in dimension so as to comprise approximately 1000–10,000 atoms, and wherein each memory cell has in a volume of approximately $6.4 \times 10^7$ cubic Angstroms which corresponds to about 300,000 atoms, such that each memory cell is comprised of a multiplicity of said quantum dots.

13. A method of performing digital memory storage as in claim 11 wherein the step of providing a plurality of two-terminal static memory cells involves providing two-terminal static memory cells wherein each quantum dot thereof is made of at least one semiconductor selected from the group consisting of:

CdS;

silicon;

germanium; and gallium-arsenide and the substrate is selected from the group consisting of:

aluminum; and silicon.

14. A method of performing digital memory storage comprising the steps of:

a. providing a system for storing and retrieving data, which, in functional combination, comprises:

means for sequentially applying D.C. and A.C. voltages/currents to memory cells which are comprised of quantum dots, said means for applying D.C. and A.C. voltages/currents including means for measuring A.C. impedance; and a plurality of two-terminal static memory cells in a substrate, each being comprised of quantum dots, wherein each two-terminal static memory cell at least two stable states can be set by application of at least two different state switching D.C. voltage levels across the two terminals thereof, said stable states being detectable by the monitoring of A.C. voltage/current magnitude response to an applied A.C. current/voltage; each said quantum dot being made of semiconductor and being approximately 10 nm in dimension so as to comprise approximately 1000–10,000 atoms, and wherein each memory cell has in a volume of approximately $6.4 \times 10^7$ cubic Angstroms which corresponds to about 300,000 atoms, such that each memory cell is comprised of a multiplicity of said quantum dots; wherein each quantum dot thereof consists of at least one semiconductor selected from the group consisting of:

CdS;

silicon;

germanium; and gallium-arsenide and the substrate is selected from the group consisting of:

aluminum; and silicon;

b. setting stable states in at least two of said two-terminal static memory cells by, for each of said at least two static memory cells, application of a D.C. voltage across the two terminals of each thereof;

c. monitoring said set stable state in at least one of said two static memory cells by monitoring of A.C. voltage/current magnitude response to an A.C. current/voltage applied to said two terminals thereof;

d. repeating steps b and c.

\* \* \* \* \*

UNITED STATES PATENT AND TRADEMARK OFFICE
CERTIFICATE OF CORRECTION

PATENT NO. : 6,501,676 B1
APPLICATION NO. : 09/878439
DATED : December 31, 2002
INVENTOR(S) : Bandyopadhyay et al.

It is certified that error appears in the above-identified patent and that said Letters Patent is hereby corrected as shown below:

Column 1 at line 7 insert the following phrase, --This invention was made with government support under grants N00014-97-1-0200, N00014-99-1-0790, and N00014-99-1-0778 awarded by the United States Navy/Office of Naval Research. The government has certain rights in the invention.--

Signed and Sealed this

Twenty-sixth Day of February, 2008

JON W. DUDAS
*Director of the United States Patent and Trademark Office*